US010607924B1

(12) United States Patent
Chiu

(10) Patent No.: US 10,607,924 B1
(45) Date of Patent: Mar. 31, 2020

(54) SEMICONDUCTOR PACKAGE STRUCTURE AND METHOD FOR PREPARING THE SAME

(71) Applicant: NANYA TECHNOLOGY CORPORATION, New Taipei (TW)

(72) Inventor: Hsih-Yang Chiu, Taoyuan (TW)

(73) Assignee: Nayna Technology Corporation, New Taipei (TW)

( * ) Notice: Subject to any disclaimer, the term of this patent is extended or adjusted under 35 U.S.C. 154(b) by 0 days.

(21) Appl. No.: 16/244,794

(22) Filed: Jan. 10, 2019

Related U.S. Application Data

(60) Provisional application No. 62/770,942, filed on Nov. 23, 2018.

(51) Int. Cl.
*H01L 23/48* (2006.01)
*H01L 21/768* (2006.01)
*H01L 23/538* (2006.01)

(52) U.S. Cl.
CPC ...... *H01L 23/481* (2013.01); *H01L 21/76832* (2013.01); *H01L 21/76843* (2013.01); *H01L 21/76898* (2013.01); *H01L 23/5383* (2013.01)

(58) Field of Classification Search
CPC ........................................... H01L 23/48
See application file for complete search history.

(56) References Cited

U.S. PATENT DOCUMENTS

2018/0005940 A1  1/2018  Chen et al.

FOREIGN PATENT DOCUMENTS

TW       201541606 A    11/2015
WO    WO2018039645 A1    3/2018

*Primary Examiner* — Marvin Payen
(74) *Attorney, Agent, or Firm* — Muncy, Geissler, Olds & Lowe, P.C.

(57) ABSTRACT

The present disclosure provides a semiconductor package structure and method for preparing the same. The semiconductor package structure includes a first substrate, a second substrate, an interconnection structure disposed between the first substrate and the second substrate, a plurality of first TSV (through silicon via) conductors penetrating the first substrate and a portion of the interconnect structure, and a plurality of second TSV conductors penetrating the first substrate and a portion of the interconnect structure. The interconnect structure includes a dielectric structure and a plurality of first connecting layers and a plurality of annular second connecting layers disposed within the dielectric structure. At least one of plurality of first TSV conductors is in contact with one of the first connecting layers. At least one of plurality of second TSV conductors is in contact with one of the annular second connecting layers and another one of the first connecting layers.

20 Claims, 9 Drawing Sheets

SEMICONDUCTOR PACKAGE STRUCTURE AND METHOD FOR PREPARING THE SAME

PRIORITY DATA

This application claims the priority benefit of U.S. provisional patent application Ser. No. 62/770,942 filed on Nov. 23, 2018. The entirety of the above-mentioned patent application is hereby incorporated by reference herein and made a part of this specification.

TECHNICAL FIELD

The present disclosure relates to a semiconductor package structure and a method for preparing the same, and more particularly, to a semiconductor package structure including a through silicon via (TSV) and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor packages.

In one approach, using a stack of at least two chips (or dies), in a 3D package to form, for example, a memory device, it is possible to produce a product having a memory capacity which is twice as large as that obtainable through other semiconductor integration processes. In addition to the increase in memory capacity, a stack package also provides improved mounting density and mounting area utilization efficiency. Due to such advantages, research and development of stack package technology has accelerated.

One type of a stack package using a through-silicon via (TSV) has been disclosed in the art. The stack package using a TSV has a structure in which the TSV is disposed in a chip so that chips are electrically connected with each other through the TSV. Generally, a TSV is formed by etching a vertical via through a substrate and filling the via with a conductive material, such as copper (Cu). Usually, the vertical vias formed through the substrate have a same depth and are aligned with pads formed in the chip. Further, specific routing lines are designed and formed to serve as the terminals on which the TSVs are disposed. However, such specific routing lines complicate the circuit design, especially in dual-dies stacking.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor package structure. The semiconductor package structure includes a first substrate having a first front surface and a first back surface opposite to the first front surface, a second substrate having a second front surface and a second back surface opposite to the second front surface, an interconnection structure disposed between the first front surface of the first substrate and the second front surface of the second substrate, a plurality of first TSV conductors penetrating the first substrate and a portion of the interconnect structure from the first back surface of the first substrate, and a plurality of second TSV conductors penetrating the first substrate and a portion of the interconnect structure from the first back surface of the first substrate. The interconnect structure includes a dielectric structure, a plurality of first connecting layers disposed within the dielectric structure, and a plurality of annular second connecting layers disposed within the dielectric structure. In some embodiments, at least one of plurality of first TSV conductors is in contact with one of the plurality of first connecting layers. In some embodiments, at least one of plurality of second TSV conductors is in contact with one of the plurality of annular second connecting layers and another one of the plurality of first connecting layers.

In some embodiments, the semiconductor package structure further includes a first etch stop layer disposed on the first connecting layer and a second etch stop layer disposed on the second connecting layer.

In some embodiments, the first etch stop layer is disposed on a surface of the first connecting layer facing the first substrate, and the second etch stop layer is disposed on a surface of the second connecting layer facing the first substrate.

In some embodiments, the surface of the first connecting layer is separated from the dielectric structure by the first etch stop layer, and the surface of the second connecting layer is separated from the dielectric structure by the second etch stop layer.

In some embodiments, the at least one of plurality of first TSV conductors passes through a portion of the dielectric structure and the first etch stop layer, and extends to the one of the first connecting layers.

In some embodiments, the at least one of plurality of second TSV conductors includes a first portion and a second portion coupled to the first portion.

In some embodiments, the first portion of the second TSV conductor passes through a portion of the dielectric structure and the second etch stop layer. In some embodiments, the second portion of the second TSV conductor passes through the annular second connecting layer, a portion of the dielectric structure and the first etch stop layer, and extends to the another one of the plurality of first connecting layers.

In some embodiments, a width of the first portion is greater than a width of the second portion.

In some embodiments, the interconnection structure further includes a plurality of third connecting layers electrically connected to the plurality of first connecting layers. In some embodiments, the plurality of third connecting layers are separated from the plurality of first TSV conductors and the plurality of second TSV conductors.

In some embodiments, an interface is formed within the interconnection structure.

In some embodiments, at least one of the plurality of first TSV conductors passes through the interface.

In some embodiments, at least one of the plurality of second TSV conductors passes through the interface.

One aspect of the present disclosure provides a method for preparing a semiconductor package structure. The method includes the following steps. A first substrate having a first front surface, a first back surface opposite to the first front surface and a first interconnection structure disposed over the first front surface is provided. A second substrate having a second front surface, a second back surface opposite to the second front surface and a second interconnection structure disposed over the second front surface is provided. The first interconnection structure and the second interconnection structure are bonded to form a third interconnection structure disposed between the first front surface of the first substrate and the second front surface of the second substrate. In some embodiments, the third interconnection structure includes a dielectric structure, a plurality of first connecting layers disposed within the dielectric structure, a plurality of first etch stop layers disposed over the plurality of first connecting layers, a plurality of annular second connecting layers disposed within the dielectric structure and a plurality of annular second etch stop layers disposed over the plurality of annular second connecting layers. A first etching is performed to form a first via opening and a second via opening penetrating the first substrate and a portion of the third interconnect structure. In some embodiments, at least one of the plurality of first etch stop layers over the first connecting layer is exposed through a bottom of the first via opening. The second via opening includes a first portion and a second portion coupled to each other. In some embodiments, the first etch stop layer over the first connecting layer is exposed through a bottom of the second portion of the second via opening. A second etching is performed to remove a portion of the first etch stop layers to expose the first connecting layers through the bottoms of the first via openings and through the bottoms of the second portions of the second via openings. A first TSV conductor is formed in the first via opening and a second TSV conductor is formed in the second via opening.

In some embodiments, the dielectric structure is exposed through a sidewall of the first via opening by the performing of the first etching, and the first etch stop layer is exposed through the sidewall of the first via opening by the performing of the second etching.

In some embodiments, the dielectric structure is exposed through a sidewall of the first portion of the second via opening by the performing of the first etching. In some embodiments, the annular second etch stop layer, the annular second connecting layer and the dielectric structure are exposed through a sidewall of the second portion of the second via opening by the performing of the first etching.

In some embodiments, the dielectric structure and the annular second etch stop layer are exposed through the sidewall of the first portion of the second via opening by the performing of the second etching. In some embodiments, the dielectric structure and the first etch stop layer are exposed through the sidewall of the second portion of the second via opening by the performing of the second etching.

In some embodiments, a width of the second portion of the second via opening is less than a width of the first portion of the second via opening.

In some embodiments, the first etch stop layer is disposed over the first connecting layer over a surface facing the first substrate, and the annular second etch stop layer is disposed over the annular connecting layer over a surface facing the first substrate.

In some embodiments, the third interconnection structure further includes a plurality of third connecting layers electrically connected to the plurality of first connecting layers and separated from the first TSV conductor and the second TSV conductor In some embodiments, an interface is formed between the first interconnection structure and the second interconnection structure.

In the present disclosure, another method for preparing the semiconductor package structure is provided. According to the method, the connecting layers designed to provide electrical connection to first and second TSV conductors are divided into two types: the first connecting layers and the annular second connecting layers. The first etch stop layer is formed over the first connecting layer, and the annular second etch stop layer is formed over the annular second connecting layer. Accordingly, the first etching will stop at the first etch stop layer, but the first etching will continue to etch the dielectric structure exposed through the annular second etch stop layer and the annular second connecting layer and finally stop at the first etch stop layer.

Consequently, the first via opening is formed with the dielectric structure exposed through the sidewall of the first via opening and the first etch stop layer exposed through the bottom of the first via opening. In contrast to the first via opening, the second via opening includes the first portion and the second portion coupled to each other. Further, the first portion and the second portion are self-aligned when formed, due to the annular configuration of the second etch stop layers and the second connecting layers. The dielectric structure is exposed through the sidewall of the first portion of the second via opening, while the dielectric structure, the annular second etch stop layer and the annular connecting layer are exposed through the sidewall of the second portion of the second via opening, and the first etch stop layer is exposed through a bottom of the second portion of the second via opening. The first etch stop layer is then removed to expose the first connecting layers. Accordingly, the dielectric structure and the first etch stop layer are now exposed through the sidewall of the first via opening, while the first connecting layer is exposed through the bottom of the first via opening. In contrast to the first via opening, the dielectric structure and the annular second etch stop layer are now exposed through the sidewall of the first portion of the second via opening, while the annular second connecting layer, the dielectric structure and the first etch stop layer are now exposed through the sidewall of the second portion of the second via opening, and the first connecting layer is exposed through the bottom of the second portion of the second via opening.

In the present disclosure, the first TSV conductor formed in the first via opening is in contact with the first connecting layer, while the second TSV conductor formed in the second via opening is in contact with the annular second connecting layer and the first connecting layer. It should be noted that by providing the first connecting layers and the annular second connecting layers, vertical electrical connection between different levels in the interconnection structure can be easily constructed. Consequently, electrical connection between the two substrates is easily constructed. Therefore, extra routing for placing the conductor having the same height is not needed.

In contrast, with a comparative method applied without the annular second etch stop layer and the annular second connecting layer, extra routing is required so that the conductors having the same height can be placed to build the electrical connection. The extra routing complicates the circuit design especially in dual-dies stacking.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
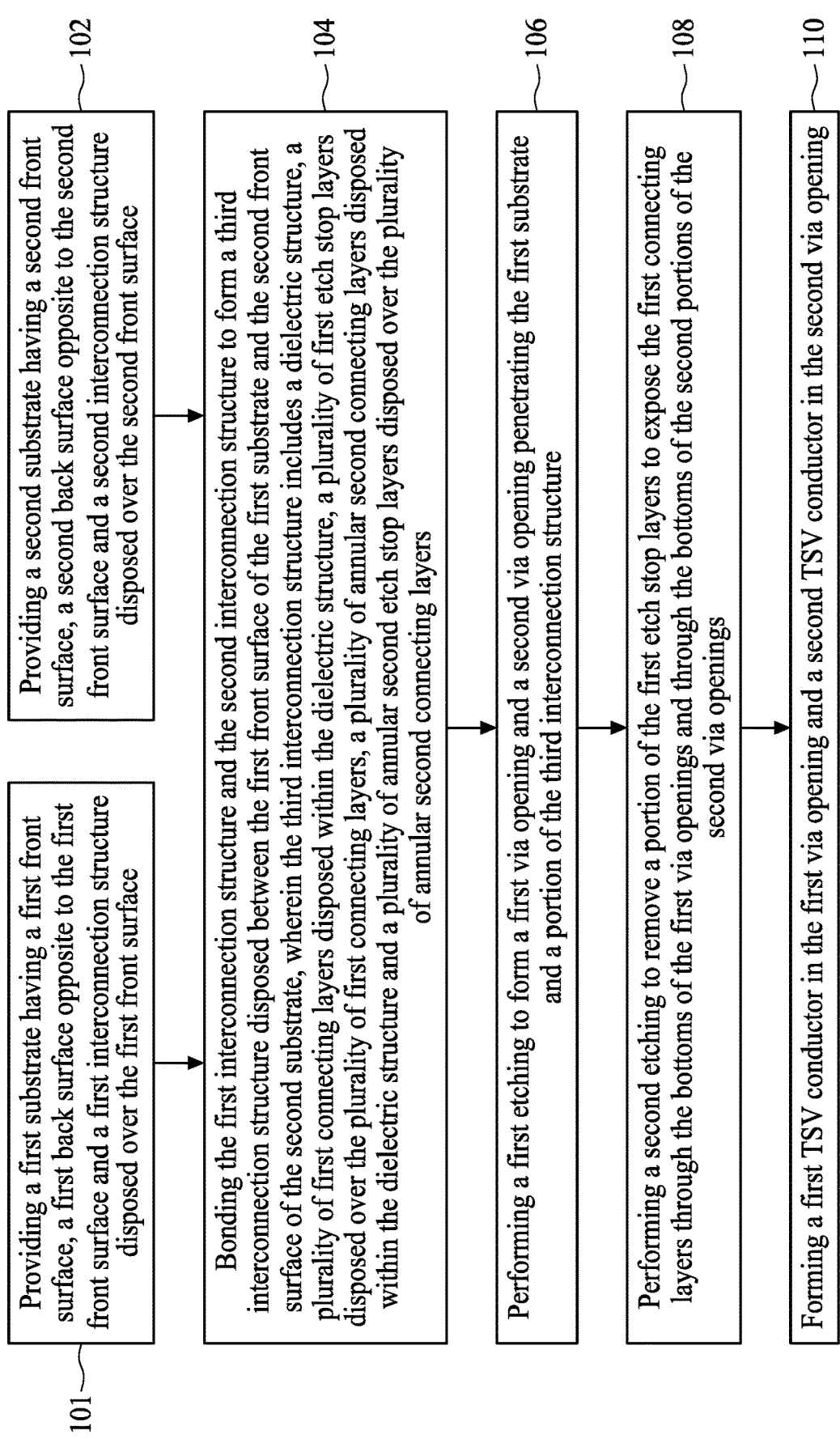
FIG. 1 is a flow diagram illustrating a method for preparing a semiconductor package structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method for preparing a semiconductor package structure in accordance with an embodiment of the present disclosure. The method for preparing a semiconductor structure 10 includes a step 101, providing a first substrate having a first front surface, a first back surface opposite to the first front surface and a first interconnection structure disposed over the first front surface. The method 10 further includes a step 102, providing a second substrate having a second front surface, a second back surface opposite to the second front surface and a second interconnection structure disposed over the second front surface. According to the embodiment, step 101 can be performed before, after or simultaneously with step 102. The method 10 further includes a step 104, bonding the first interconnection structure and the second interconnection structure to form a third interconnection structure disposed between the first front surface of the first substrate and the second front surface of the second substrate. In some embodiments, the third interconnection structure includes a dielectric structure, a plurality of first connecting layers disposed within the dielectric structure, a plurality of first etch stop layers disposed over the plurality of first connecting layers, a plurality of annular second connecting layers disposed within the dielectric structure and a plurality of annular second etch stop layers disposed over the plurality of annular second connecting layers. The method 10 further includes a step 106, performing a first etching to form a first via opening and a second via opening penetrating the first substrate and a portion of the third interconnect structure. In some embodiments, at least one of the plurality of first etch stop layers over the first connecting layer is exposed through a bottom of the first via opening. In some embodiments, the second via opening includes a first portion and a second portion coupled to each other, and the first etch stop layer over the first connecting layer is exposed through a bottom of the second portion of the second via opening. The method 10 further includes a step 108, performing a second etching to remove a portion of the first etch stop layer to expose the first connecting layers through the bottoms of the first via openings and through the bottoms of the second portions of the second via openings. The method 10 further includes a step 110, forming a first TSV conductor in the first via opening and a second TSV conductor in the second via opening. The method for preparing the semiconductor package structure 10 will be further described according to one or more embodiments below.

Figure 2:
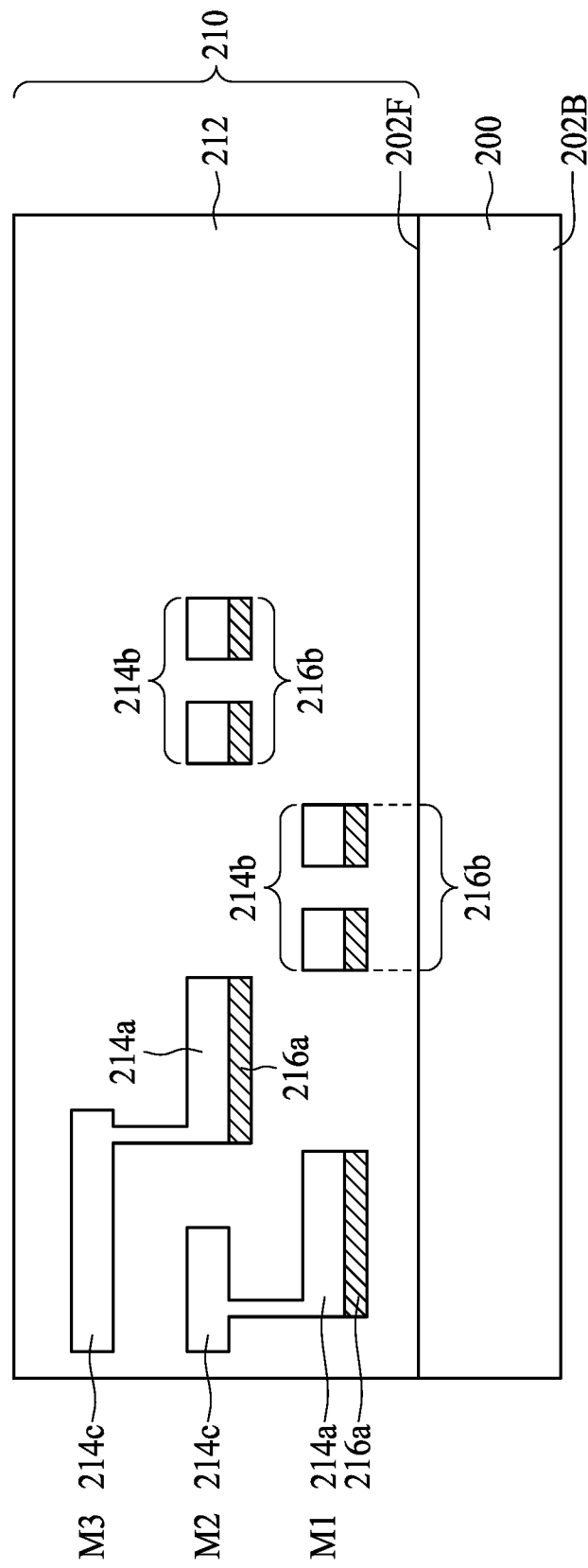
FIG. 2 is a schematic drawing illustrating a fabrication stage of the method for preparing the semiconductor package structure in accordance with an embodiment of the present disclosure.

FIG. 2 is a schematic drawing illustrating a fabrication stage of the method for preparing the semiconductor package structure in accordance with an embodiment of the present disclosure. Referring to FIG. 2, a substrate 200 is provided according to step 101. In some embodiments, the substrate 200 can include silicon (Si). In other embodiments, the substrate 200 can include gallium (Ga), gallium arsenide (GaAs), gallium nitride (GaN), strained silicon, silicon-germanium (SiGe), silicon carbide (SiC), diamond, epitaxy layer or a combination thereof, but the disclosure is not limited thereto. In still other embodiments, the substrate 200 can include a silicon-on-insulator (SOI) substrate, but the disclosure is not limited thereto. The substrate 200 has a front surface 202F and a back surface 202B opposite to the front surface 202F, as shown in FIG. 2. In some embodiments, a circuit layer (not shown) is formed over the substrate 200 on the front surface 202F. The circuit layer may include circuit patterns or circuit devices such as transistors, capacitors and or diodes, but the disclosure is not limited thereto. Accordingly, the front surface 202F can be referred to as an active surface, but the disclosure is not limited thereto.

The substrate 200 further includes an interconnection structure 210 disposed over the front surface 202F. The interconnection structure 210 includes a dielectric structure 212 formed of a plurality dielectric layers, wherein a plurality of connecting layers are formed in the plurality of dielectric layers. The dielectric structure 212 used to isolate the connecting layers is also known as the inter-metal dielectric (IMD) layer. The dielectric structure 212 can include, for example but not limited thereto, silicon oxide (SiO), TEOS, phosphorus silicon glass (PSG) or boron-phosphorus silicon glass (BPSG). The connecting layers in different dielectric layers are usually described as being in different levels, with the first to nth levels referred to as M1 to Mn. For example, the interconnection structure 210 includes three levels, and the first level to the third level are referred to as M1 to M3, as shown in FIG. 2. However, those skilled in the art should easily realize that the numbers of levels is not limited to 3. The substrate 200 with the circuit layer and the interconnection structure 210 disposed thereon may be a semiconductor wafer or a die to be used in a 3D chip package, wafer-level package (WLP) or wafer bonding process.

Still referring to FIG. 2, in the embodiment, the connecting layers in the interconnection structure 210 are formed according to different purposes. For example, the connecting layers 214a and 214b are designated to be electrically connected to via conductors, while the connecting layers 214c are designated to be internal connecting layers without being in contact with the via conductors. In some embodiments, the connecting layers 214a, 214b and 214c can be formed by a conventional process such as, for example but not limited thereto, a dual damascene process. The connecting layers 214a and 214b are different from the connecting layers 214c. As shown in FIG. 2, an etch stop layer 216a is disposed over a surface of the connecting layer 214a facing the substrate 200, and an etch stop layer 216b is disposed over a surface of the connecting layer 214b facing the substrate 200. In contrast to the connecting layers 214a and 214b, the connecting layers 214c have no etch stop layer provided on any surface thereof, as shown in FIG. 2. In some embodiments, the connecting layers 214a, 214b and 214c can include conductive material such as tungsten (W), tungsten silicide (WSi), aluminum (Al), titanium (Ti), titanium nitride (TiN), cobalt (Co), but the disclosure is not limited thereto.

Significantly, the connecting layers 214a and 214b are divided into two configurations according to their roles in the electrical connection. In some embodiments, the connecting layers 214a serve as terminals of the vertical electrical connection, and therefore are designed to include a plate configuration, with the etch stop layers 216a covering the surface of the connecting layers 214a also having a plate configuration. Accordingly, a sufficient landing area for a via conductor is provided by the connecting layers 214a. The connecting layers 214c are electrically connected to each other and/or to the connecting layers 214a.

Figure 4A:
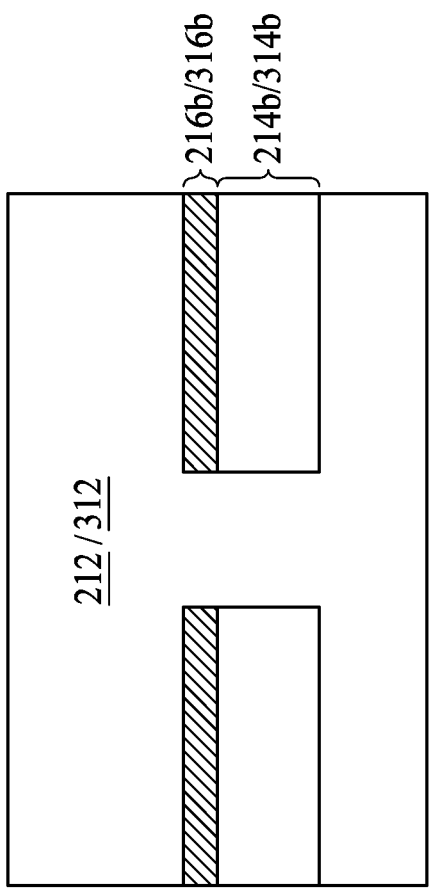
FIG. 4A is a cross-sectional view of a portion of FIG. 2 and FIG. 3.
Figure 4C:
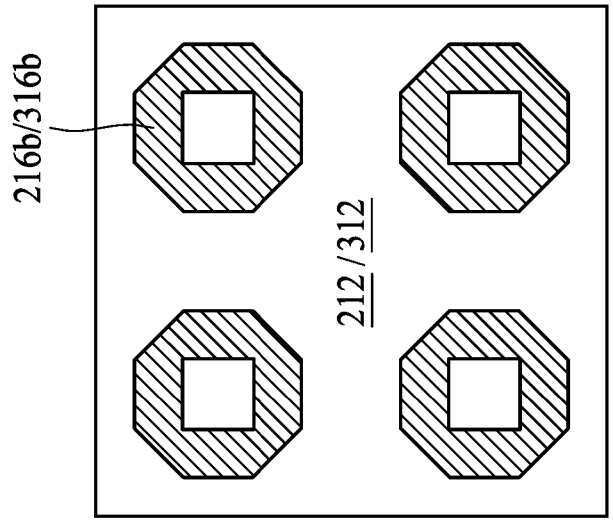
FIG. 4C is a schematic drawing of a view opposite to the view shown in FIG. 4B.
Figure 4B:
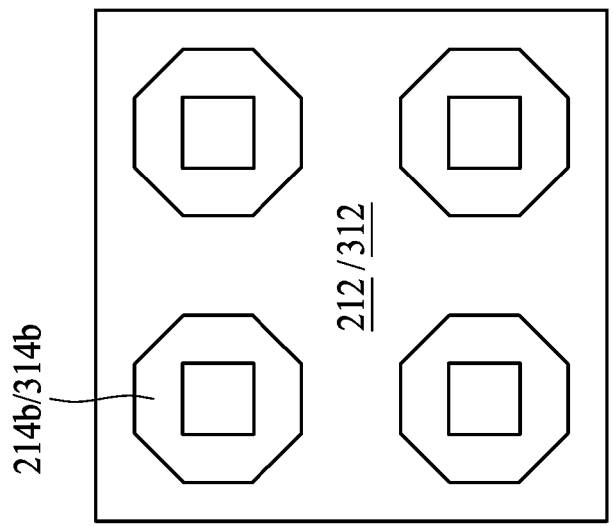
FIG. 4B is a schematic drawing of a top view or, alternatively, a bottom view of FIG. 4A.

Referring to FIGS. 4A to 4C, in some embodiments, the connecting layers 214b serve as a part of the vertical connection. Therefore, the connecting layers 214b are designed to include an annular configuration, and the etch stop layers 216b covering the surface of the connecting layers 214b are also designed to include an annular configuration. Referring to FIGS. 2 and 4B, in a top view of the annular connecting layer 214b and the annular etch stop layer 216b, the dielectric structure 212 can be observed from a center of the annular connecting layers 214b and the annular etch stop layers 216b. Referring to FIGS. 2 and 4C, in a bottom view of the annular connecting layer 214b and the annular etch stop layer 216b, the annular etch stop layer 216b covers the surface of the connecting layer 214b entirely in order to provide protection.

Significantly, the etch stop layers 216a and the annular etch stop layers 216b include different materials or materials sufficiently different in composition that the etch stop layers 216a and the annular etch stop layers 216b can be selectively removable using an appropriate etch chemistry relative to the dielectric structure 212. In some embodiments, the etch stop layers 216a and the annular etch stop layers 216b can include the same material, such as silicon nitride (SiN) or silicon oxynitride (SiON), but the disclosure is not limited thereto.

Figure 3:
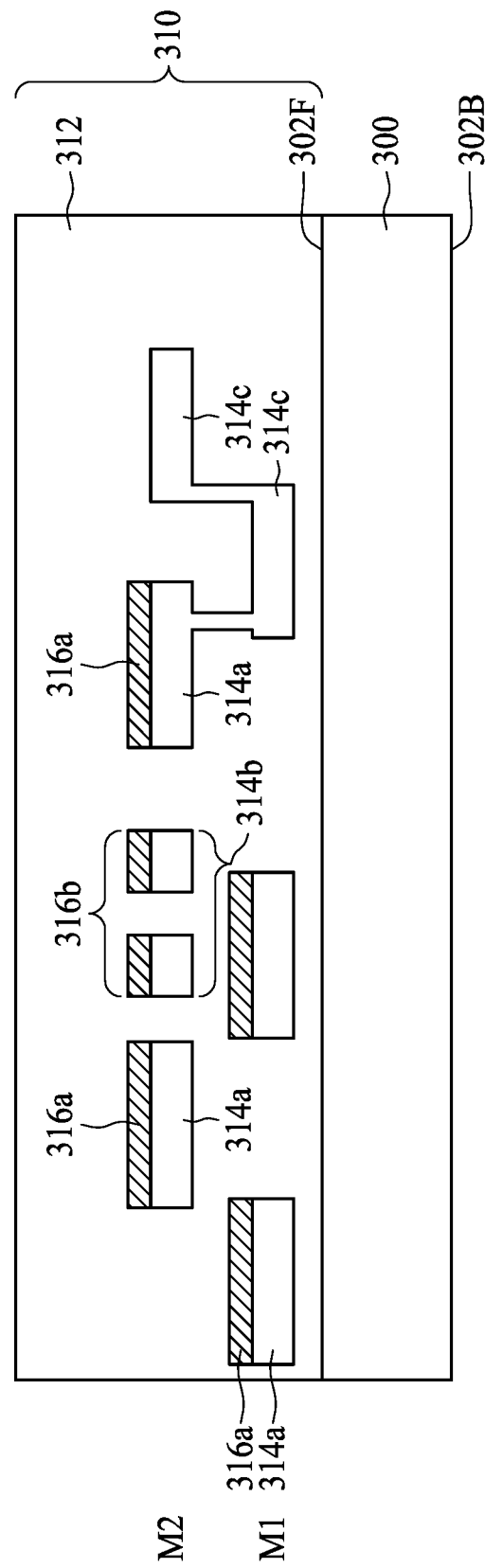
FIG. 3 is a schematic drawing illustrating a fabrication stage of the method for preparing the semiconductor package structure in accordance with an embodiment of the present disclosure.

Referring to FIG. 3, which is a schematic drawing illustrating a fabrication stage of the method for preparing the semiconductor package structure in accordance with the embodiment of the present disclosure, a substrate 300 is provided according to step 102. As mentioned above, the step 101 can be performed before, after or simultaneously with step 102 in accordance with the embodiment. In some embodiments, the substrate 300 can include Si. In other embodiments, the substrate 300 can include Ga, GaAs, GaN, strained silicon, SiGe, SiC, diamond, epitaxy layer or a combination thereof, but the disclosure is not limited thereto. In still other embodiments, the substrate 300 can include an SOI substrate, but the disclosure is not limited thereto. The substrate 300 has a front surface 302F and a back surface 302B opposite to the front surface 302F, as shown in FIG. 3. In some embodiments, a circuit layer (not shown) is formed on or in the substrate 300 on the front surface 302F. The circuit layer may include circuit patterns or circuit devices such as transistors, capacitors and/or diodes, but the disclosure is not limited thereto. Accordingly, the front surface 302F can be referred to as an active surface, but the disclosure is not limited thereto.

The substrate 300 further includes an interconnection structure 310 disposed over the front surface 302F. The interconnection structure 310 includes a dielectric structure 312 formed of a plurality dielectric layers, wherein a plurality of connecting layers are formed in the plurality of dielectric layers. The dielectric structure 312 used to isolate the connecting layers is also known as the IMD layer. The dielectric structure 312 can include, for example but not limited thereto, SiO, TEOS, PSG or BPSG. The connecting layers in different dielectric layers are usually described as being in different levels, with the first to nth levels are referred to as M1 to Mn. For example, the interconnection structure 310 includes two levels, and the first level and the second level are referred to as M1 and M2, as shown in FIG. 3. However, those skilled in the art should easily realize that the number of levels is not limited to 2. The substrate 300 with the circuit layer and the interconnection structure 310 disposed thereon may be a semiconductor wafer or a die to be used in a 3D chip package, wafer-level package (WLP) or wafer bonding process.

Still referring to FIG. 3, in the embodiment, the connecting layers in the interconnection structure 310 are formed according to different purposes. For example, the connecting layers 314a and 314b are designated to be electrically connected to via conductors, while the connecting layers 314c are designated to be internal connecting layers without being in contact with the via conductors. In some embodiments, the connecting layers 314a, 314b and 314c can be formed by a conventional process such as, for example but not limited thereto, a dual damascene process. The connecting layers 314a and 314b are different from the connecting layers 314c. As shown in FIG. 3, an etch stop layer 316a is disposed over a surface of the connecting layer 314a opposite to the substrate 300, and an etch stop layer 316b is disposed over a surface of the connecting layer 314b opposite to the substrate 300. Unlike the connecting layers 314a and 314b, the connecting layers 314c have no etch stop layer provided on any surface thereof, as shown in FIG. 3. In some embodiments, the connecting layers 314a, 314b and 314c can include conductive material such as W, WSi, Al, Ti, TiN, or Co, but the disclosure is not limited thereto.

Significantly, the connecting layers 314a and 314b are divided into two configurations according to their roles in the electrical connection. In some embodiments, the connecting layers 314a serve as terminals of the vertical electrical connection, and therefore are designed to include a plate configuration, with the etch stop layers 316a covering the surface of the connecting layers 314a also including a plate configuration. Accordingly, a sufficient landing area for a via conductor is provided by the connecting layers 314a. Further, the connecting layers 314c are electrically connected to each other and/or to the connecting layers 314a.

Referring to FIGS. 4A to 4C, in some embodiments, the connecting layers 314b serve as a part of the vertical connection. Therefore, the connecting layers 314b are designed to include an annular configuration, and the etch stop layers 316b covering the surface of the connecting layers 314b are also designed to include an annular configuration. Referring to FIGS. 3 and 4B, in a bottom view of the annular connecting layer 314b and the annular etch stop layer 316b, the dielectric structure 312 can be observed in a center of the annular connecting layer 314b and the annular etch stop layer 316b. Referring to FIGS. 3 and 4C, in a top view of the annular connecting layer 314b and the annular etch stop layer 316b, the annular etch stop layer 316b covers the surface of the connecting layer 314b entirely in order to provide protection.

Significantly, the etch stop layer 316a and the annular etch stop layer 316b include different materials or materials sufficiently different in composition that the etch stop layer 316a and the annular etch stop layer 316b can be selectively removable using an appropriate etch chemistry relative to the dielectric structure 312. In some embodiments, the etch stop layer 316a and the annular etch stop later 316b can include the same material, such as SiN or SiON, but the disclosure is not limited thereto.

Figure 5:
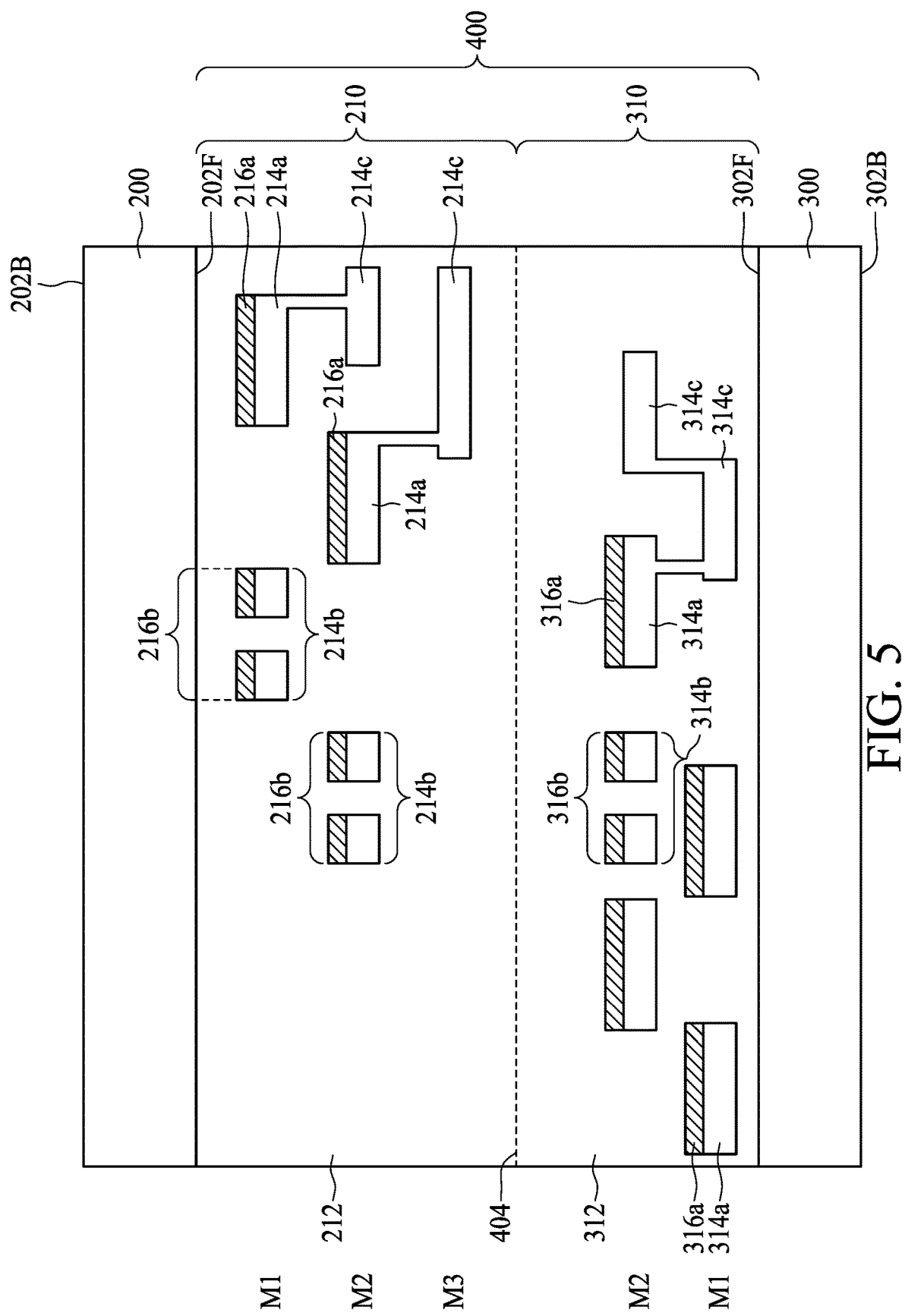
FIGS. 5 to 9 are schematic diagrams illustrating various fabrication stages of the method for preparing the semiconductor package structure in accordance with the embodiment of the present disclosure.

Referring to FIG. 5, next, the substrate 200 and the substrate 300 are bonded. In some embodiments, the substrate 200 is flipped to be bonded to the substrate 300, as shown in FIG. 5. In some alternative embodiments, the substrate 300 can be flipped to be bonded to the substrate 200, though not shown. It should be noted that the substrate 200 and the substrate 300 are bonded in a face-to-face manner. By stacking dies having different functions vertically in the face-to-face manner, a face-to-face communication is implemented between the dies of different functions. In addition, stacking dies having different functions vertically in the face-to-face manner reduces the occupied area of the semiconductor apparatus, as compared to a semiconductor apparatus with dies of different functions arranged in a laterally adjacent manner. Furthermore, the signal path of the dies of different functions vertically stacked in the face-to-face manner is shorter than the signal path of the dies of different functions arranged in a laterally adjacent manner; consequently, the dies of different functions vertically stacked in the face-to-face manner of the present disclosure can be applied to high-speed electronic devices.

In some embodiments, the interconnection structure 210 and the interconnection structure 310 are bonded to form an interconnection structure 400 disposed between the front surface 202F of the substrate 200 and the front surface 302F of the substrate 300, according to step 104. The interconnection structure 400 therefore includes the dielectric structure 402 formed by the dielectric structures 212, 312 and the connecting layers 214a to 214c and 314a to 314c. In some embodiments, an interface 404 is formed between the interconnection structure 210 and the interconnection structure 310. In other words, the interface 404 is formed within the interconnection structure 400.

Figure 6:
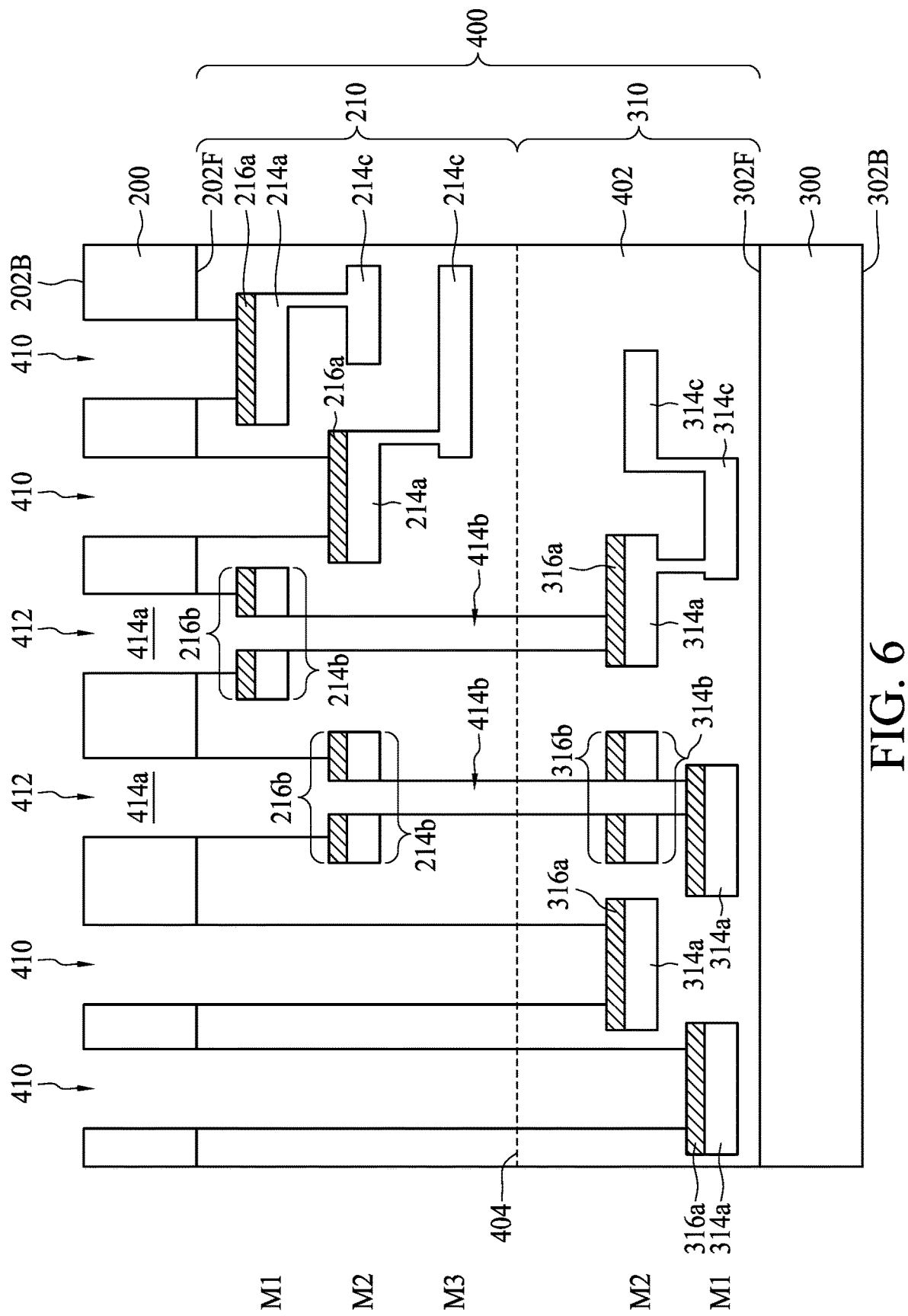

Referring to FIG. 6, a first etching is performed to form a first via opening 410 and a second via opening 412 penetrating the substrate 200 and a portion of the interconnection structure 400, according to step 106. In some embodiments, the first etching is performed to the back surface 202B of the substrate 200, as shown in FIG. 6. It should be noted that the first etching removes portions of the dielectric structure 402 and stops at the etch stop layers 216a, 316a to form the first via openings 410. Significantly, the first etching removes portions of the dielectric structure 402 from the center of the annular etch stop layers 216b, 316b and the center of the annular connecting layers 214b, 314b, and stops at the etch stop layers 216a, 316a to form the second via openings 412. Accordingly, the first via openings 402 and the second via openings 404 are formed with the same depth or different depths, as shown in FIG. 6. In some embodiments, the substrate 200 and the dielectric structure 402 are exposed through a sidewall of the first via opening 410 by the performing of the first etching, while the etch stop layers 216a, 316a are exposed through a bottom of the first via opening 410 by the performing of the first etching. It should be noted that the depth of the first via openings 402 can be the same or different from each other. In some embodiments, the depths of the first via openings 410 are determined by the level where the etch stop layers 216a, 316a are located, as shown in FIG. 6.

Still referring to FIG. 6, the second via opening 412 includes a first portion 414a and a second portion 414b coupled to each other. In some embodiments, by the performing of the first etching, the substrate 200 and the dielectric structure 402 are exposed through a sidewall of the first portion 414a of the second via opening 412, while the annular etch stop layers 216b, 316b are exposed through a bottom of the first portion 414a of the second via opening 412. Further, by the performing of the first etching, the annular connecting layers 214b, 314b and the dielectric structure 402 are exposed through a sidewall of the second portion 414b of the second via opening 412, while the etch stop layers 216a, 316a are exposed through a bottom of the second portion 414b of the second via opening 412. A width of the second portion 414b of the second via opening 412 is less than a width of the first portion 414a of the second via opening 412. In some embodiments, the width of the second portion 414b is substantially equal to an inside diameter of the annular etch stop layers 216b, 316b, or substantially equal to an inside diameter of the annular connecting layers 214b, 314b, but the disclosure is not limited thereto. Accordingly, the first portion 414a and the second portion 414b are self-aligned when formed due to the annular configuration of the annular etch stop layers 216b, 316b and the annular connecting layers 214b, 314b. It should be noted that a depth of the first portion 414a and a depth of the second portion 414b can be the same or different from each other. In some embodiments, the depths of the first portions 414a are determined by the level where the annular etch stop layers 216b, 316b are located, while the depth of the second portions 414b are determined by the level where the etch stop layers 216a, 316a are located, as shown in FIG. 6.

It should be noted that because an etching rate of the etch stop layers is different from that of the dielectric structure 402, the first via opening 410 and the second via openings 412 can be formed without damaging the etch stop layers 216a, 216b, 316a and 316b.

Figure 7:
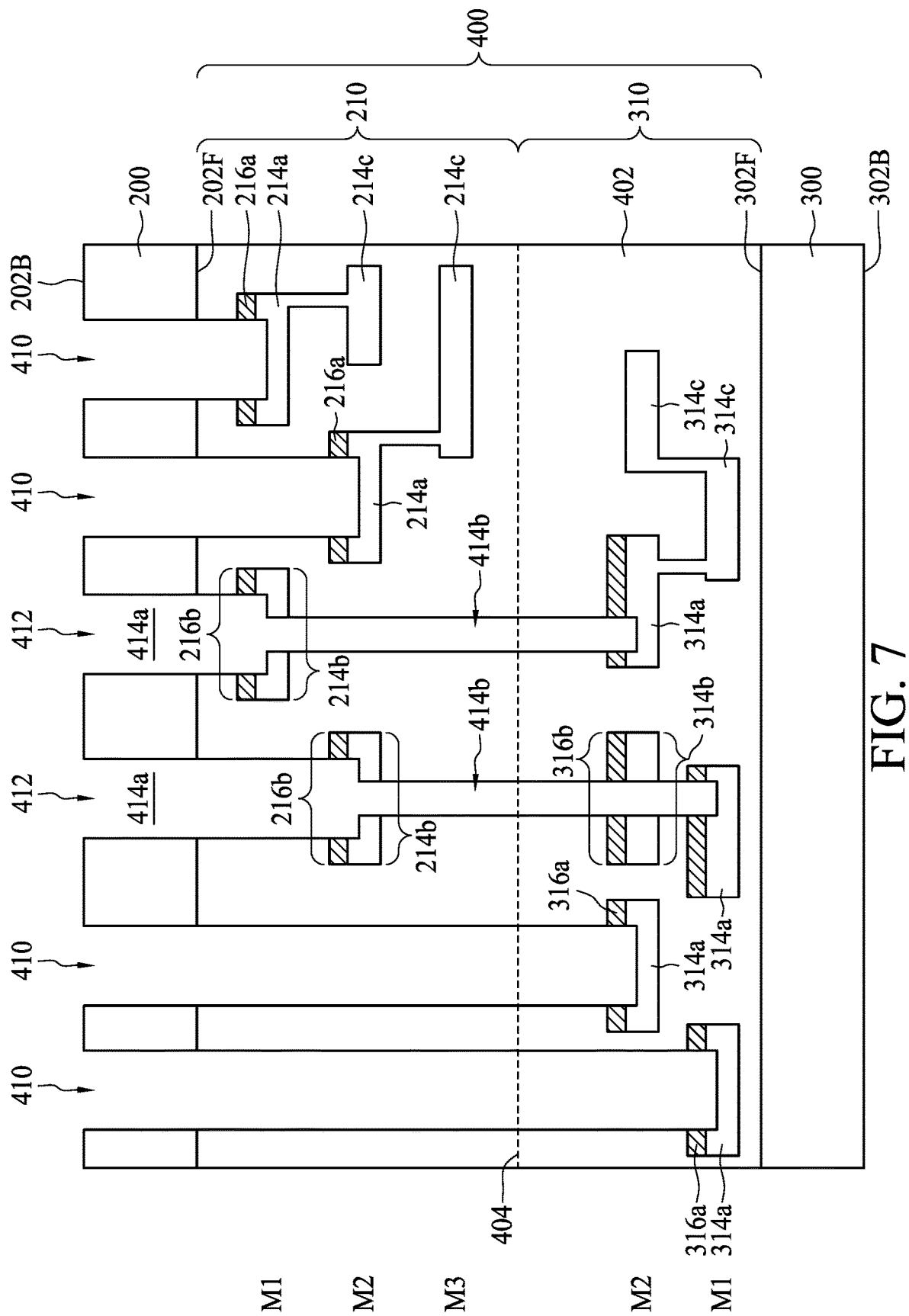

Referring to FIG. 7, a second etching is performed to remove the etch stop layers 216a, 316a from the bottom of the first and second via openings 410 and 412, according to step 108. Accordingly, the connecting layers 214a, 314a are exposed through the bottom of the first via openings 410. In some embodiments, the substrate 200, the dielectric structure 402 and the etch stop layers 216a, 316a are exposed through the sidewall of the first via opening 410 by the performing of the second etching, while the connecting layers 214a, 314a are now exposed through the bottom of the first via opening 410 by the performing of the second etching.

Still referring to FIG. 7, by the performing of the second etching, the substrate 200, the dielectric structure 402 and the annular etch stop layers 216b, 316b are exposed through the sidewall of the first portion 414a of the second via opening 412, while the connecting layers 214a, 314a are now exposed through the bottom of the second portion 414b of the second via opening 412.

It should be noted that because an etching rate of the etch stop layers is different from that of the dielectric structure 402, the etch stop layers 216a, 216b, 316a, 316b can be removed without damaging the dielectric structure 402, as shown in FIG. 7.

Figure 8:
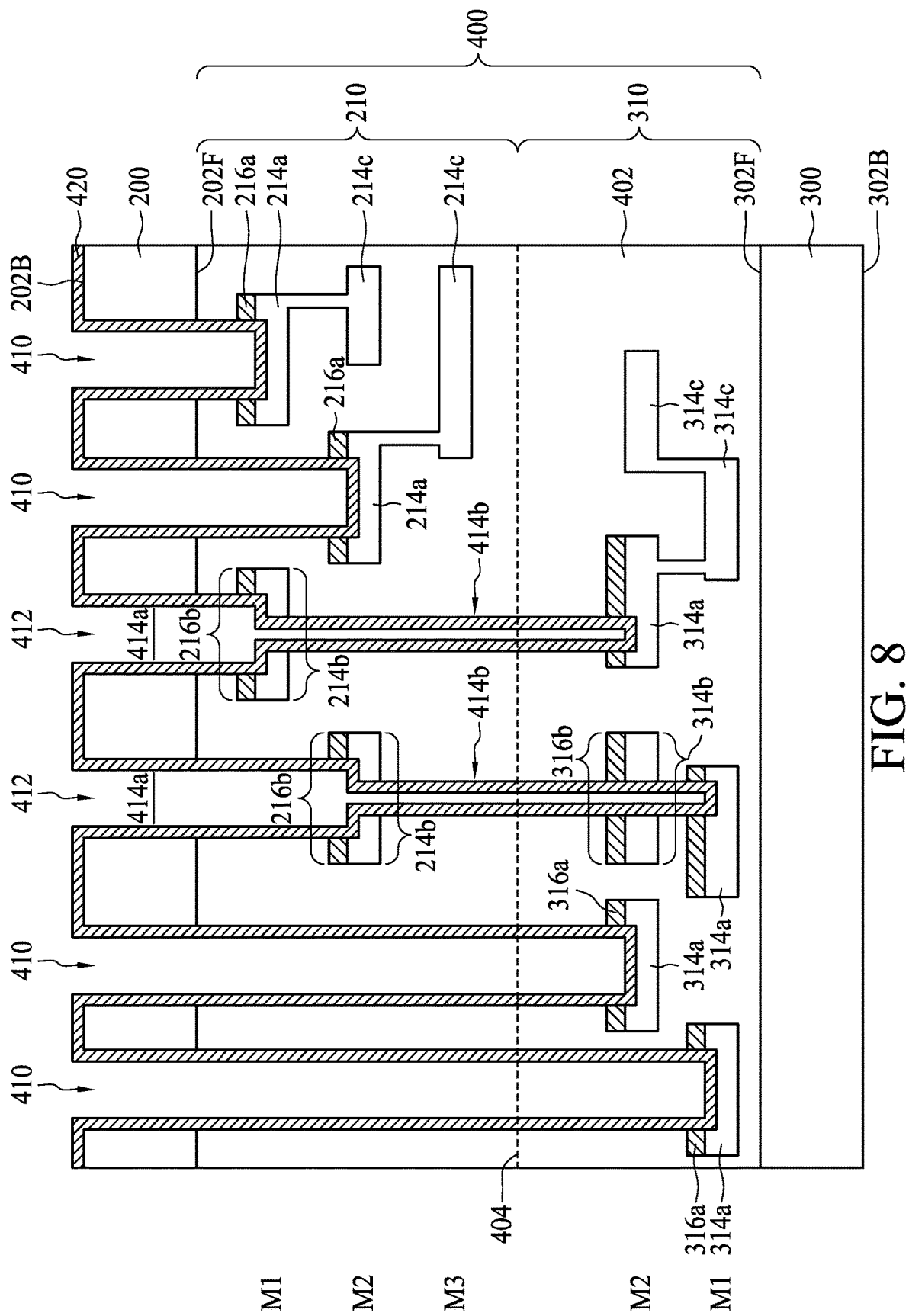
Figure 9:
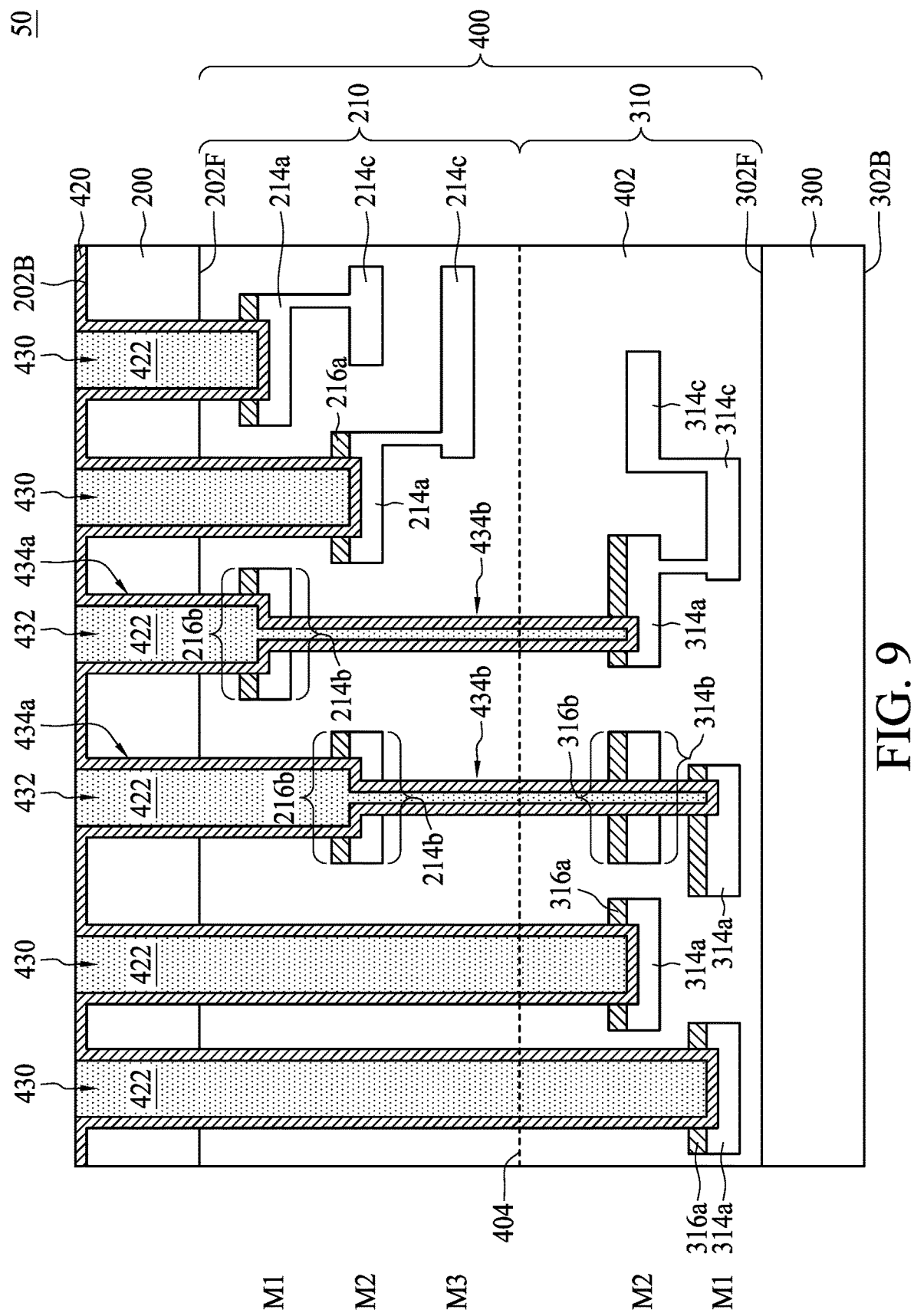

Referring to FIGS. 8 and 9, a first TSV conductor 430 is formed in the first via opening 410, and a second TSV conductor 432 is formed in the second via opening 412, according to step 110. In some embodiments, step 110 can further include the following steps. For example, a barrier/glue layer 420 is disposed on the sidewalls and bottoms of the first via openings 410 and second via openings 412, as shown in FIG. 8. In some embodiments, the barrier/glue layer 420 may comprise Ta, TaN, Ti, TiN, W, WN, Mo, Mn, Ti/Cu and/or Cu, but the disclosure is not limited thereto.

Referring to FIG. 9, a conductive material 422, such as Cu, is next formed to fill the first and second via conductors 410 and 412. Accordingly, the first TSV conductors 430 and the second TSV conductors 432 are obtained, as shown in FIG. 9.

As shown in FIG. 9, a semiconductor package structure 50 is provided. The semiconductor package structure 50 includes a substrate 200 having a front surface 202F and a back surface 202B opposite to the front surface 202F, a substrate 300 having a front surface 302F and a back surface 302B opposite to the front surface 302F, an interconnection structure 400 disposed between the front surface 202F of the substrate 200 and the front surface 302F of the substrate 300, a plurality of first TSV conductors 430 penetrating the substrate 200 and a portion of the interconnect structure 400 from the back surface 202B of the substrate 200, and a plurality of second TSV conductors 432 penetrating the substrate 200 and a portion of the interconnect structure 400 from the back surface 202B of the substrate 200. In some embodiments, at least one of the first TSV conductors 430 passes through the interface 404. In some embodiments, at least one of the second TSV conductors 432 passes through the interface 404.

As shown in FIG. 9, the interconnect structure 400 includes a dielectric structure 402, a plurality of connecting layers 214a, 314a disposed within the dielectric structure 402 and a plurality of annular connecting layers 214b, 314b disposed within the dielectric structure 402. In some embodiments, at least one of the first TSV conductors 430 is in contact with one of the connecting layers 214a or 314a. In some embodiments, at least one of the second TSV conductors 432 is in contact with one of the annular second connecting layers 214b, 314b and another one of the connecting layers 214a or 314a. As mentioned above, the interconnection structure 400 can further include a plurality of connecting layers 214c, 314c that are electrically connected to each other and/or to the connecting layers 214a, 314a. However, the connecting layers 214c, 314c are separated from the first TSV conductors 430, the second TSV conductors 432, and the annular connecting layers 214b, 314b, as shown in FIG. 9.

In some embodiments, the semiconductor package structure 50 further includes an etch stop layer 216a, 316a disposed on the connecting layer 214a, 314a and an annular etch stop layer 216b, 316b disposed on the annular connecting layer 214b, 314b. Further, the etch stop layers 216a, 316a are disposed on a surface of the connecting layers 214a, 314a facing the substrate 200, and the annular etch stop layers 216b, 316b are disposed on a surface of the annular connecting layers 214b, 314b facing the substrate 200. Therefore, the surface of the connecting layer 214a, 314a is separated from the dielectric structure 402 by the etch stop layer 216a, 316a, and the surface of the annular connecting layer 214b, 314b is separated from the dielectric structure 402 by the annular etch stop layer 216b, 316b.

As shown in FIG. 9, the first TSV conductor 430 passes through a portion of the dielectric structure 402 and the etch stop layer 216a, 316a, and extends to one of the connecting layers 214a or 314a.

In some embodiments, at least one of plurality of second TSV conductors 432 includes a first portion 434a and a second portion 434b coupled to the first portion 434a. In some embodiments, the first portion 434a of the second TSV conductor 432 passes through a portion of the dielectric structure 402 and the annular etch stop layer 216b, 316b. In some embodiments, the second portion 434b of the second TSV conductor 432 passes through the annular connecting layer 214b, 314b, a portion of the dielectric structure 402 and the etch stop layer 216a, 316a, and extends to the another one of the connecting layers 214a or 314a.

Still referring to FIG. 9, the first TSV conductor 430 can have a consistent width, the first portion 434a of the second TSV conductor 432 can have a consistent width, and the second portion 434b of the second TSV conductor 432 can have a consistent width. In some embodiments, the first TSV conductors 430 can include the same width. In other embodiments, the first TSV conductors 430 can include different widths, as shown in FIG. 9. For example, when a first TSV conductor 430 is electrically connected to a power supply or is grounded, the width of such first TSV conductor 430 can be greater than the width of other first TSV conductors 430, but the disclosure is not limited thereto. Similarly, in some embodiments, the second TSV conductors 432 can include the same width. In other embodiments, the second TSV conductors 432 can include different widths.

For example, when a second TSV conductor 432 is electrically connected to a power supply or is grounded, the width of such second TSV conductor 432 can be greater than the width of other second TSV conductors 432, but the disclosure is not limited thereto. Further, a width of the first portion 434a is greater than a width of the second portion 434b. In some embodiments, the width of the first portion 434a is less than an outside diameter of the annular etch stop layer 216b, 316b, or less than an outside diameter of the annular connecting layer 214b, 314b, but the disclosure is not limited thereto. However, the width of the first portion 434a is greater than an inside diameter of the annular etch stop layer 216b, 316b, or greater than an inside diameter of the annular connecting layer 214b, 314b, but the disclosure is not limited thereto. In some embodiments, the width of the second portion 434b is substantially equal to the inside diameter of the annular etch stop layer 216b, 316b, or substantially equal to the inside diameter of the annular connecting layer 214b, 314b, but the disclosure is not limited thereto.

In the present disclosure, a method for preparing the semiconductor package structure 10 is provided. According to the method 10, the connecting layers 214a, 214b, 314a and 314b designed to provide electrical connection to the first and second TSV conductors 430 and 432 are divided into two types: the connecting layers 214a and 314a, and the annular connecting layers 214b and 314b. The etch stop layer 216a, 316a is formed over the connecting layer 214a, 314a, and the annular etch stop layer 216b, 316b is formed over the annular connecting layer 214b, 314b. Therefore, the first etching will stop at the etch stop layers 216a, 316a, but the first etching will continue to etch the dielectric structure 402 through the annular etch stop layers 216b, 316b and the annular connecting layers 214b, 314b and finally stop at the etch stop layers 216a, 316a. Consequently, the first via opening 410 and the second via opening 412 are formed. The second via opening 412 includes the first portion 414a and the second portion 414b coupled to each other. Further, the first portion 414a and the second portion 414b are self-aligned when formed due to the annular configuration of the annular etch stop layers 216b, 316b and the annular connecting layers 214b, 314b. The etch stop layers 216a, 316a are then removed to expose the connecting layer 214a, 314a by the performing of the second etching.

In the present disclosure, the first TSV conductor 430 formed in the first via opening 410 is in contact with the connecting layer 214a, 314a, while the second TSV conductor 432 formed in the second via opening 412 is in contact with the annular connecting layer 214b, 314b and the connecting layer 214a, 314a. It should be noted that because the connecting layers 214a, 314a and the annular connecting layers 214b, 314b are provided, vertical electrical connection between different levels in the interconnection structure 400 can be easily formed. Consequently, electrical connection between the two substrates 200 and 300 is easily formed. Therefore, extra routing for placing the conductor at the same height is not needed.

In contrast, with a comparative method applied without the annular second etch stop layer and the annular second connecting layer, extra routing is required so that the conductors having the same height can be placed to form the electrical connection. The extra routing complicates the circuit design, especially in dual-dies stacking.

One aspect of the present disclosure provides a semiconductor package structure. The semiconductor package structure includes a first substrate having a first front surface and a first back surface opposite to the first front surface, a second substrate having a second front surface and a second back surface opposite to the second front surface, an interconnection structure disposed between the first front surface of the first substrate and the second front surface of the second substrate, a plurality of first TSV conductors penetrating the first substrate and a portion of the interconnect structure from the first back surface of the first substrate, and a plurality of second TSV conductors penetrating the first substrate and a portion of the interconnect structure from the first back surface of the first substrate. The interconnect structure includes a dielectric structure, a plurality of first connecting layers disposed within the dielectric structure and a plurality of annular second connecting layers disposed within the dielectric structure. In some embodiments, at least one of plurality of first TSV conductors is in contact with one of the plurality of first connecting layers. In some embodiments, at least one of plurality of second TSV conductors is in contact with one of the plurality of second connecting layers and another one of the plurality of first connecting layers.

One aspect of the present disclosure provides a method for preparing a semiconductor package structure. The method includes the following steps. A first substrate having a first front surface, a first back surface opposite to the first front surface and a first interconnection structure disposed over the first front surface is provided. A second substrate having a second front surface, a second back surface opposite to the second front surface and a second interconnection structure disposed over the second front surface is provided. The first interconnection structure and the second interconnection structure are bonded to form a third interconnection structure disposed between the first front surface of the first substrate an the second front surface of the second substrate. In some embodiments, the third interconnection structure includes a dielectric structure, a plurality of first connecting layers disposed within the dielectric structure, a plurality of first etch stop layers disposed over the plurality of first connecting layers, a plurality of annular second connecting layers, and a plurality of annular second etch stop layers disposed over the plurality of annular second connecting layers. A first etching is performed to form a first via opening and a second via opening penetrating the first substrate and a portion of the third interconnect structure. In some embodiments, the plurality of first etch stop layers over the plurality of first connecting layers are exposed through a bottom of the first via opening. The second via opening includes a first portion and a second portion coupled to each other. In some embodiments, the first etch stop layer over the first connecting layer is exposed through a bottom of the second portion of the second via opening. A second etching is performed to remove a portion of the first etch stop layers to expose the first connecting layers through the bottom of the first via opening and the bottom of the second portion of the second via opening. A first TSV conductor is formed in the first via opening and a second TSV conductor is formed in the second via opening.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor package structure, comprising:
    a first substrate comprising a first front surface and a first back surface opposite to the first front surface;
    a second substrate comprising a second front surface and a second back surface opposite to the second front surface;
    an interconnection structure disposed between the first front surface of the first substrate and the second front surface of the second substrate, wherein the interconnection structure comprises a dielectric structure, a plurality of first connecting layers disposed within the dielectric structure and a plurality of annular second connecting layers disposed within the dielectric structure;
    a plurality of first TSV conductors penetrating the first substrate and a portion of the interconnection structure from the first back surface of the first substrate;
    a plurality of second TSV conductors penetrating the first substrate and a portion of the interconnection structure from the first back surface of the first substrate,
    wherein at least one of plurality of first TSV conductors is in contact with one of the plurality of first connecting layers, and at least one of plurality of second TSV conductors is in contact with one of the plurality of annular second connecting layers and another one of the plurality of first connecting layers.

2. The semiconductor package structure of claim 1, further comprising a first etch stop layer disposed on the first connecting layer and a second etch stop layer disposed on the second connecting layer.

3. The semiconductor package structure of claim 2, wherein the first etch stop layer is disposed on a surface of the first connecting layer facing the first substrate, and the second etch stop layer is disposed on a surface of the second connecting layer facing the first substrate.

4. The semiconductor package structure of claim 3, wherein the surface of the first connecting layer is separated from the dielectric structure by the first etch stop layer, and the surface of the second connecting layer is separated from the dielectric structure by the second etch stop layer.

5. The semiconductor package structure of claim 2, wherein the at least one of plurality of first TSV conductors passes through a portion of the dielectric structure and the first etch stop layer, and extends to the one of the first connecting layers.

6. The semiconductor package structure of claim 2, wherein the at least one of plurality of second TSV conductors comprises a first portion and a second portion coupled to the first portion.

7. The semiconductor package structure of claim 6, wherein the first portion of the second TSV conductor passes through a portion of the dielectric structure and the second etch stop layer, and the second portion of the second TSV conductor passes through the annular second connecting layer, a portion of the dielectric structure and the first etch stop layer, and extends to the another one of the first connecting layers.

8. The semiconductor package structure of claim 6, wherein a width of the first portion is greater than a width of the second portion.

9. The semiconductor package structure of claim 1, wherein the interconnection structure further comprises a plurality of third connecting layers electrically connected to the plurality of first connecting layers and separated from the plurality of first TSV conductors and the plurality of second TSV conductors.

10. The semiconductor package structure of claim 1, wherein an interface is formed within the interconnection structure.

11. The semiconductor package structure of claim 10, wherein at least one of the plurality of first TSV conductors passes through the interface.

12. The semiconductor package structure of claim 10, wherein at least one of the plurality of second TSV conductors passes through the interface.

13. A method for preparing a semiconductor package structure, comprising:
    providing a first substrate having a first front surface, a first back surface opposite to the first front surface, and a first interconnection structure disposed over the first front surface;
    providing a second substrate having a second front surface, a second back surface opposite to the second front surface, and a second interconnection structure disposed over the second front surface;
    bonding the first interconnection structure and the second interconnection structure to form a third interconnection structure disposed between the first front surface of the first substrate and the second front surface of the second substrate, wherein the third interconnection structure comprises a dielectric structure, a plurality of first connecting layers disposed within the dielectric structure, a plurality of first etch stop layers disposed over the plurality of first connecting layers, a plurality of annular second connecting layers disposed within the dielectric structure and a plurality of annular second etch stop layers disposed over the plurality of annular second connecting layers;
    performing a first etching to form a first via opening and a second via opening penetrating the first substrate and a portion of the third interconnect structure, wherein the plurality of first etch stop layers over the plurality of first connecting layers are exposed through a bottom of the first via opening, the second via opening comprises a first portion and a second portion coupled to each other, and the etch stop layer over the first connecting layer is exposed through a bottom of the second portion of the second via opening;
    performing a second etching to remove a portion of the first etch stop layers to expose the first connecting layers through the bottoms of the first via openings and through the bottoms of the second portions of the second via openings; and
    forming a first TSV conductor in the first via opening and a second TSV conductor in the second via opening.

14. The method of claim 13, wherein the dielectric structure is exposed through a sidewall of the first via opening by the performing of the first etching, and the first etch stop layer is exposed through the sidewall of the first via opening by the performing of the second etching.

15. The method of claim 13, wherein the dielectric structure is exposed through a sidewall of the first portion of the second via opening, and the annular second etch stop layer, the annular second connecting layer and the dielectric structure are exposed through a sidewall of the second portion of the second via opening by the performing of the first etching.

16. The method of claim 15, wherein the dielectric structure and the annular second etch stop layer are exposed through the sidewall of the first portion of the second via opening, and the dielectric structure and the first etch stop layer are exposed through the sidewall of the second portion of the second via opening by the performing of the second etching.

17. The method of claim 13, wherein a width of the second portion of the second via opening is less than a width of the first portion of the second via opening.

18. The method of claim 13, wherein the first etch stop layer is disposed over the first connecting layer over a surface facing the first substrate, and the annular second etch stop layer is disposed over the annular connecting layer over a surface facing the first substrate.

19. The method of claim 13, wherein the third interconnection structure further comprises a plurality of third connecting layers electrically connected to the plurality of first connecting layers and separated from the first TSV conductor and the second TSV conductor.

20. The method of claim 13, wherein an interface is formed between the first interconnection structure and the second interconnection structure.

* * * * *